United States Patent [19]

Sims

[11] Patent Number: 4,806,703
[45] Date of Patent: Feb. 21, 1989

[54] PANEL SYSTEM FOR EMI SHIELDED ENCLOSURES

[75] Inventor: Richard E. Sims, Arlington Hgts., Ill.

[73] Assignee: The Curran Company, Addison, Ill.

[21] Appl. No.: 142,666

[22] Filed: Jan. 11, 1988

[51] Int. Cl.$^4$ .............................................. H05K 9/00
[52] U.S. Cl. .............................................. 174/35 MS
[58] Field of Search .................................... 174/35 MS

[56] References Cited

U.S. PATENT DOCUMENTS

| | | | |
|---|---|---|---|
| 2,704,301 | 3/1955 | Feketics | 174/35 MS |
| 2,793,245 | 5/1957 | Dunn | 174/35 MS |
| 2,860,176 | 11/1958 | Lindgren | 174/35 MS |
| 3,070,646 | 12/1962 | Lindgren | 174/35 MS |
| 3,246,072 | 4/1966 | Lindgren | 174/35 MS |
| 3,322,879 | 5/1967 | Lindgren | 174/35 MS |
| 4,740,654 | 4/1988 | Lindgren | 174/35 MS |

Primary Examiner—Arthur T. Grimley
Assistant Examiner—David A. Tone
Attorney, Agent, or Firm—Mason, Kolehmainen, Rathburn & Wyss

[57] ABSTRACT

A panel system for EMI (electromagnetic interference) shielded enclosures includes panels having a framework, a substrate attached to the framework and a shielding layer overlying the substrate at the face of the panel and extending around the panel edges. Edge frame members of the framework are capable of floating or flexing to assure intimate contact between the shielding layers of adjacent panels when the panels are attached together to make a shielded enclosure. Seams between adjacent panels are provided with grooves for positively defining regions of contact and shielding the fasteners used to join the adjacent panels.

23 Claims, 3 Drawing Sheets

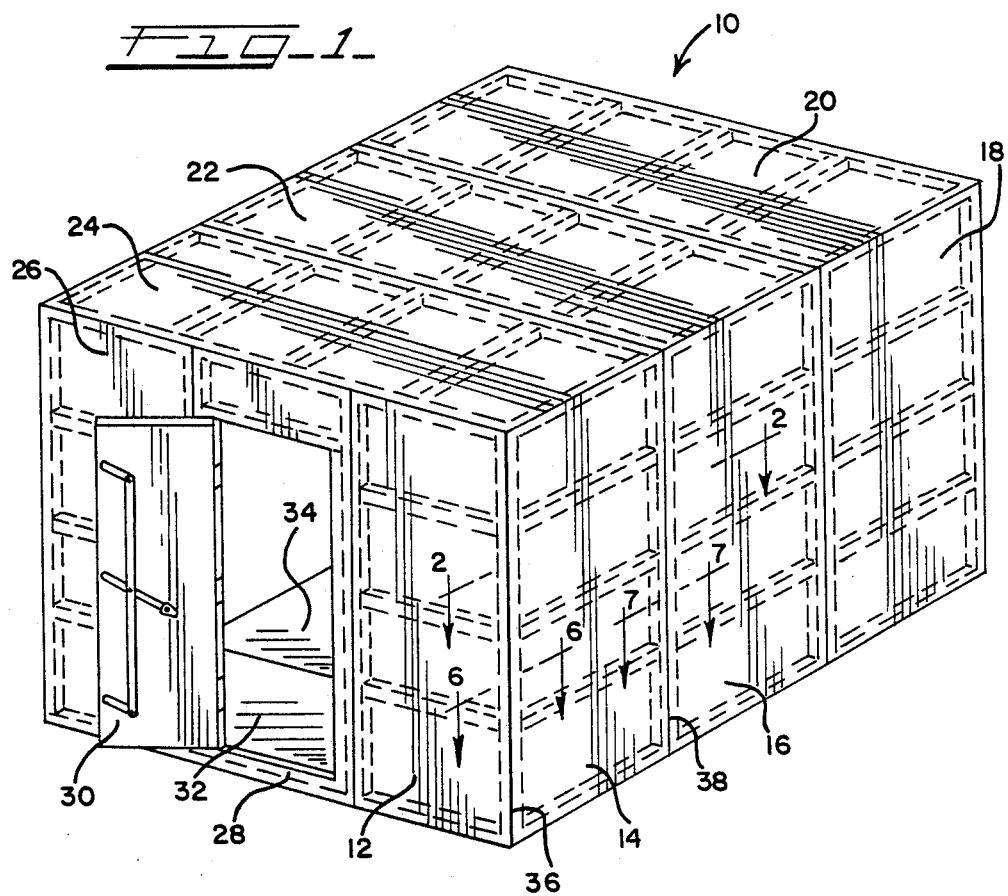
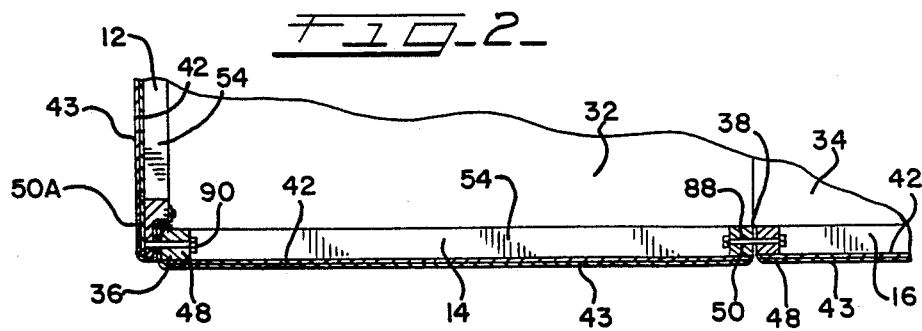

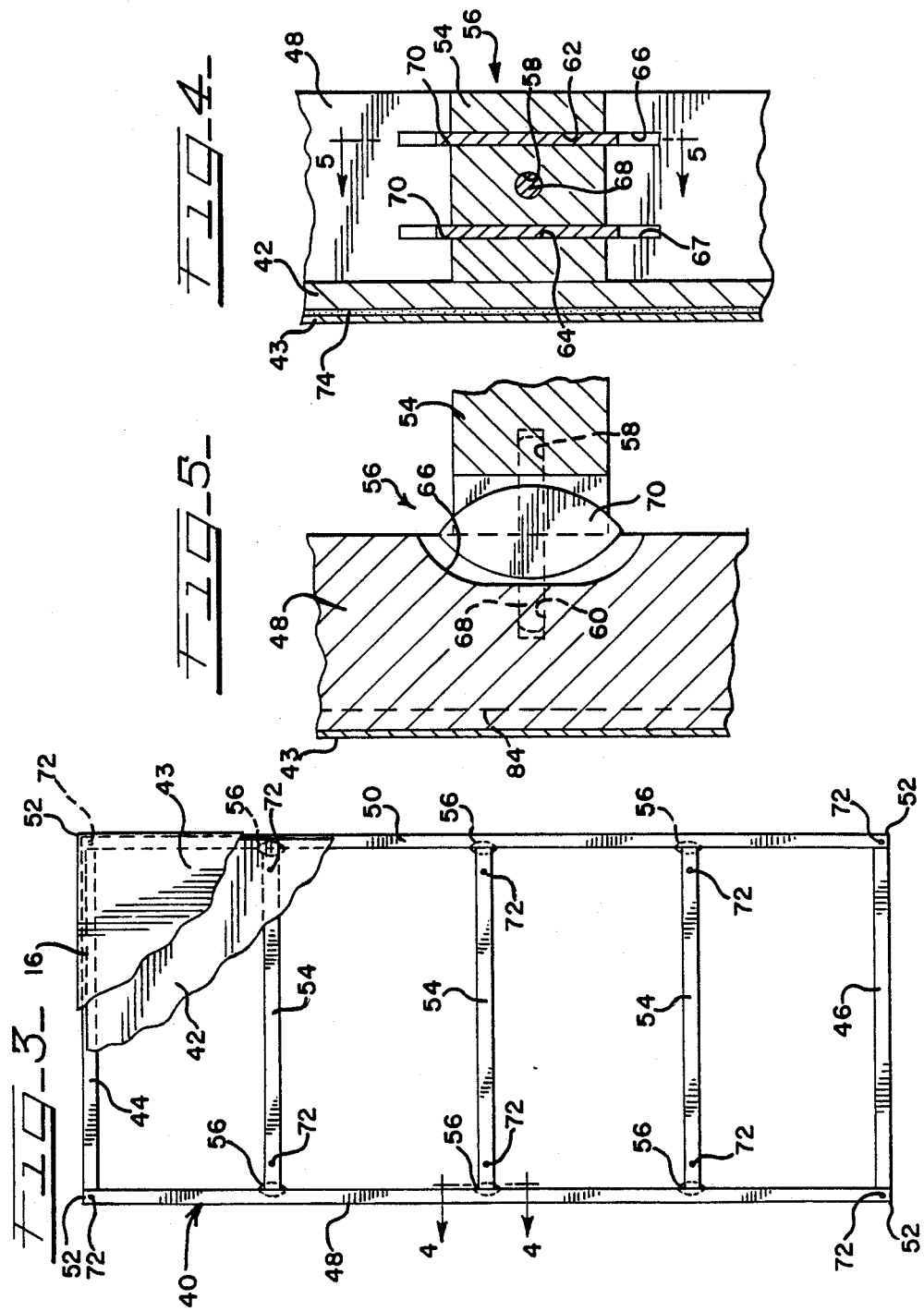

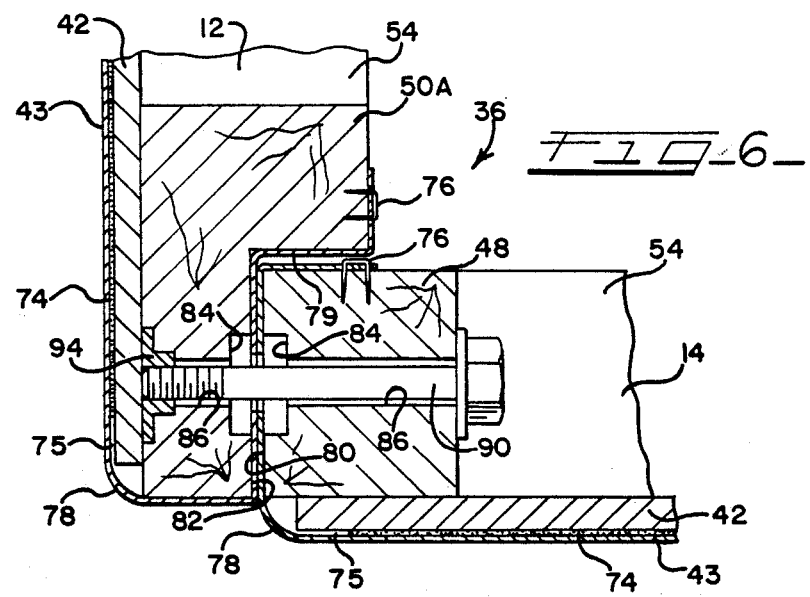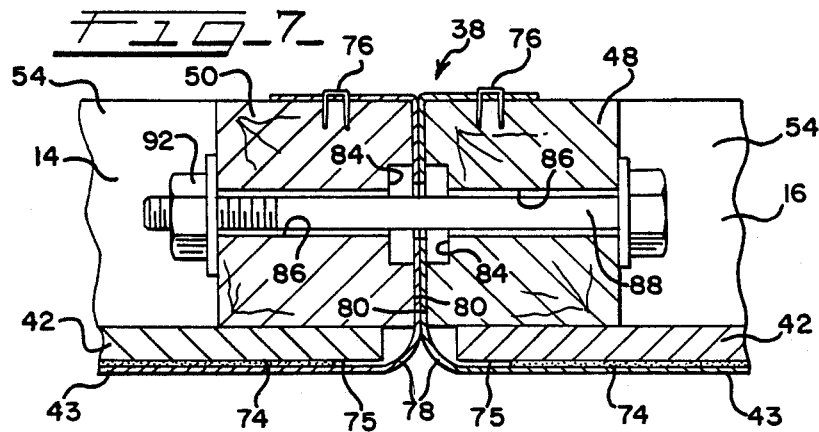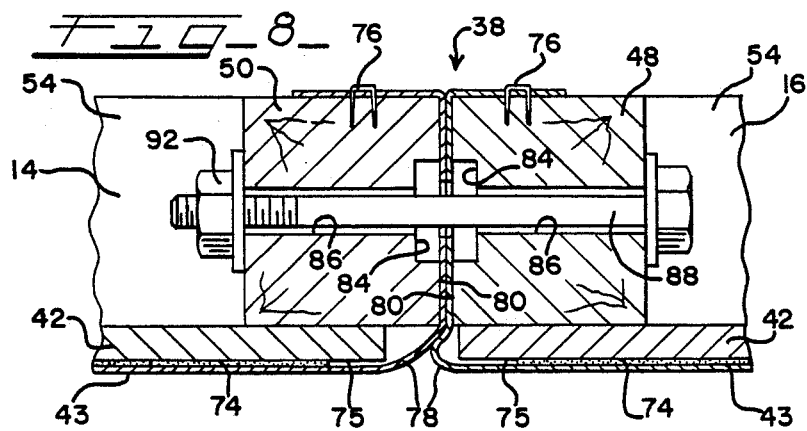

PANEL SYSTEM FOR EMI SHIELDED ENCLOSURES

The present invention relates to panel systems for EMI (electromagnetic interference) shielded enclosures, and more particularly to improvements in shielded panels and panel seams for EMI shielded enclosures.

BACKGROUND OF THE INVENTION

EMI shielded enclosures are used when sensitive equipment or the like must be isolated from interference due to ambient electromagnetic radiation. An enclosure may also be used to confine radiation within the enclosure. A commonly used type of enclosure is a room surrounded by a layer of electrically conductive material such as metal or metal screen. Convenience and cost savings can be realized by using panels to form the walls, ceiling and floor of the enclosure. This approach permits the panels to be prefabricated as modules that can subsequently be assembled together to complete the enclosure.

A modular system includes a number of panels each having a support or frame covered with a layer of conductive material. When the panels are assembled, seams are present at the abutting panel edges. At each seam, the conductive layers of adjacent panels should be in contact so that the layers of individual panels when connected together can form an effectively continuous conductive barrier completely around the enclosure.

A typical panel used in prior modular panel systems includes a framework with edge frame members and internal frame members each rigidly attached at one end to an edge frame member and attached in a floating manner at the opposite end to an opposed edge frame member. A conductive layer overlies the framework. The fragile conductive layer is largely unsupported and is subject to damage. The addition of a rigid substrate panel between the framework and the conductive layer to reinforce and strengthen the conductive layer would result in the edge frame members being rigid and complete contact along the seams between conductive layers of abutting panels could not be consistently achieved. Bolts are used to hold the frames together at the edges of adjacent panels. Gaps in contact between the shielding layers of adjacent panels can degrade the ability of the shield to attenuate interference. If the edge frame members did flex, the rigid substrate could tear the conductive layer at the panel corners when adjacent panels were forced together.

Another difficulty can arise when the panel edges are not precisely perpendicular to the faces of the panel. It is important that the fasteners used to join the panel edges be within the shielding layer. In some cases, the conductive layers of adjacent panels may contact one another at the inner part of the seam rather than near the panel face. When this occurs, the fasteners are outside of the region of contact and can act as coupling members decreasing the desired shielding performance.

SUMMARY OF THE INVENTION

A primary object of this invention is to provide an improved panel system for EMI shielded enclosures in which conductivity between adjacent panel edges is maximized. Other objects are to provide an improved panel construction in which the panel edges have the ability to conform in shape at a panel seam to assure intimate contact along the length of the seam; to provide a panel in which the fragile conductive layer is reinforced and the necessary strength of the panel is maintained even though the panel edge is permitted to flex; to provide a panel construction in which the conductive layer at the panel edge is able to accommodate flexing of the panel edge without ripping or tearing; to provide a panel seam assuring that the fasteners used to join adjacent panels are within the region of contact of the conductive layers of adjacent panels; to provide a panel seam in which two lines of contact are provided along the length of adjacent panels to assure maximum conductivity; to provide a panel system permitting the use of relatively economical materials and construction procedures without sacrificing shielding performance; and to provide a panel system for EMI shielded enclosures overcoming problems encountered with past enclosures and panel systems.

In brief, the above and other objects of the present invention are realized by providing a panel for an EMI shielded enclosure having a panel frame including edge frame elements located at the periphery of the panel and an internal frame element extending between a pair of the edge frame elements. A substantially rigid shield support member or substrate overlies the panel frame at a face of the panel. A flexible layer of metal shield material overlies the shield support member and extends around the edge frame elements. The flexible layer is attached to the shield support member and the shield support member is attached to the internal frame element. A floating attachment structure joins the internal frame element to the edge frame elements for permitting the edge frame elements to assume an edge configuration independent of the shield support member and the internal frame element.

Objects of the invention are also achieved by providing a panel seam construction for an EMI shielded enclosure. First and second panels each have a face and an edge including an edge frame member. A pair of layers of conductive shielding material cover the faces of and extend across the edge frame members of the first and second panels. The edge frame members each have an outer corner adjacent the panel face, an inner corner spaced from the panel face and a generally planar abutment surface extending between the corners. At least one of the edge frame members has an elongated groove extending along at least part of its length in the abutment surface to define a recess in the abutment surface between the corners. A fastener extends through the edge frame members of the first and second panels for drawing the edge frame members together in abutting, parallel, side-by-side relationship with the layers clamped between the abutment surfaces. The fastener extends along a line intersecting the recess.

DESCRIPTION OF THE VIEWS OF THE DRAWING

The invention together with the above and other objects and advantages may best be understood from the following detailed description of the preferred embodiment of the invention shown in the accompanying drawings, wherein:

FIG. 1 is a perspective view of a shielded enclosure made with a panel system embodying the invention;

FIG. 2 is an enlarged sectional view taken along the line 2—2 of FIG. 1;

FIG. 3 is a plan view of one of the panels of FIG. 1 with parts broken away to show the components of the structure;

FIG. 4 is a sectional view on an enlarged scale taken along the line 4—4 of FIG. 3;

FIG. 5 is a sectional view taken along the line 5—5 of FIG. 4;

FIG. 6 is an enlarged sectional view of a corner seam between adjacent panels, taken along the line 6—6 of FIG. 1;

FIG. 7 is an enlarged sectional view of an inline seam between adjacent panels, taken along the line 7—7 of FIG. 1; and FIG. 8 is a view similar to FIG. 7 illustrating flexing at a panel seam.

DETAILED DESCRIPTION OF THE PREFERRED EMBODIMENT

Having reference now to the drawings, and initially to FIG. 1, there is illustrated a shielded enclosure generally designated as 10 built with a panel system constructed in accordance with the principles of the present invention. This panel system includes a number of panels including wall panels 12, 14 and 16, parts of which are illustrated in more detail in FIGS. 2-8. Also seen in FIG. 1 are additional wall panels 18 and 26, a door panel 28 including a door 30, floor panels 32 and 34 and ceiling panels 20, 22 and 24. The panels may be prefabricated and then assembled in place at the site of the enclosure 10. While the invention is illustrated in connection with panels 12, 14 and 16, the remaining panels preferably are similar in construction.

Panels 12 and 14 are joined at a corner seam 36 illustrated in more detail in FIGS. 2 and 6. Panels 14 and 16 are joined at an in-line seam 38 illustrated in more detail in FIGS. 2, 7 and 8. Preferably similar corner seams and in-line seams are used throughout the enclosure 10 for all of the panel junctions.

The construction of panel 16 is typical in most respects of the other panels of the enclosure 10 and is illustrated in FIGS. 3-5. In general, it includes a framework designated as a whole as 40, a substrate 42 and a conductive shielding layer 43. Panel 16 is a modular unit that can be manufactured and then stored and/or shipped to the point of use prior to incorporation into enclosure 10.

Framework 40 includes four edge frame members 44, 46, 48 and 50. Members 44 and 46 are disposed at the top and bottom of panel 16 while members 48 nd 50 define the opposed sides of the panel. The panel includes four corners 52 defined at the intersections of the edge frame members 44-50. A plurality of internal frame members 54 span the width of the panel 16 and extend between the side frame members 48 and 50. The frame members may be formed of an inexpensive material such as nominal 2"×2" or other lumber. The length of the frame members and the number and position of the internal frame members 54 is selected in accordance with the size and shape of the finished panel 16 to provide the desired panel strength. The need for precisely dimensioned or high quality material is avoided by the present invention because the need for precise initial fit between panel edges is reduced.

At the corners 52, the edge frame members 44-50 are rigidly joined in any conventional manner. A preferred method is to use a keyed and glued joint. In contrast, and in accordance with a feature of the invention, the internal frame members 54 are not rigidly attached to the side frame members 48 and 50, but rather are joined at both ends by floating attachment structures 56. Attachment structures 56 hold the internal frame members 54 in position along the length of the side frame members 48 and 50 while permitting both of the side frame members 48 and 50 to move laterally with a floating or flexing action.

One of the floating attachment structures 56 is seen in FIGS. 4 and 5 where the joint between one internal frame member 54 and the side frame member 48 is illustrated. The end of frame member 54 abutting frame member 48 is provided with a central drilled opening 58 aligned with a similar opening 60 in frame 48. Openings 58 and 60 are flanked by slots 62 and 64 in frame member 54 and by an aligned pair of slots 66 and 67 in frame member 48. A dowel pin 68 is received in openings 58 and 60, while key members 70 are received in slots 62 and 64 and the aligned slots 66 and 67 in frame member 48. No glue or adhesive is employed in the floating attachment structure 56, and frame member 48 may float or move relative to frame member 54 in the direction parallel to the face of the panel 16, i.e., the direction of the axis of the internal frame member 54. The pin 68 and the keys 70 hold the frame member in position relative to frame member 48 and provide substantial strength in the direction perpendicular to the panel face so that the finished panel 16 has ample strength for use in the enclosure 10.

After the framework 40 has been constructed, the substrate 42 is attached to the framework 40. The periphery of the panel 16 is defined by the outline of the edge frame members 44-50. The substrate 42 is slightly smaller in each dimension and its peripheral edges are slightly inset from the panel edges. Substrate 42 is preferably a relatively strong and rigid sheet or panel of material such as hardboard or the like. It is attached to the framework 40 by fasteners such as screws located only at certain selected positions to preserve the ability of the edge frame members 44-50 to float relative to the panel 16. The fastening positions are designated by the reference character 72 in FIG. 3.

One attachment point 72 is located at or near each corner 52 of the panel in the regions where the edge frame members 44-50 are rigidly secured together. Additional attachment points 72 are located on each of the internal frame members 54. If desired for further strength, the substrate 42 may be bonded by adhesive to the internal frame members 54 and/or to the edge frame members 44-50 at the corners 72 only. Because the substrate 42 is not attached to the edge frame members 44-50 except at the four corners 52, the remaining portions of each edge frame member can flex within the panel 16. The floating attachment structures 56 permit the side frame members 48 and 50 to flex or float parallel to the panel face. The end frame members 44 and 46 are attached in framework 40 only at their ends and may flex or float both parallel to and perpendicular to the face of the panel 16.

Conductive shielding layer 43 is a continuous web or sheet of electrically conductive material. Depending on the shielding requirements of enclosure 10, layer 43 may be formed of a metallic sheet material or a mesh or screen of metal wire. A preferred material is three ounce copper sheet or foil that may be provided with a paper backing layer or other type of backing for added durability.

Layer 43 is attached to the panel 16 after the substrate 42 is fastened to the framework 40. The layer 43, if a material like thin copper foil is used, is delicate and fragile, and the substrate 43 provides the strength necessary to prevent damage to the layer. The layer 43 is bonded to the face of the panel 16 by a film 74 of adhesive. The film 74 is placed over nearly the entire surface of the substrate 42, but an adhesive free region 75 is retained around the periphery of the substrate 42 (FIGS. 6-8) to assure that adhesive does not inadvertently flow beyond the edges of the substrate 42 where it might bond the substrate 42 to an edge frame member 44-50 or otherwise interfere with the performance of joints 36 and 38.

The entire face of the panel 16 is covered with shielding layer 43. In addition, the layer 43 extends fully around the edges of the panel defined by edge frame members 44-50. As can be seen in FIGS. 6-8, the layer 43 extends around each of the edge frame members to the back face of the panel where it is attached to the frame member by staples 76 or in any other desired fashion.

A region of slack 78 is provided in the layer 43 between the outer edges of the substrate 42 and the outer edges of the edge frame members 44-50. Slack 78 is achieved by curving the layer gently in this area, rather than stretching it tightly around the panel edge. The provision of the slack 78 is facilitated because of the offset of the edges of substrate 42 from the outer bounds of the panel.

Each of the panels employed in the enclosure 10 may be similar in construction to the panel 16. Panel 16 is typical of a panel having in-line seams 38 along both of its sides in the assembled enclosure 10. Where a corner seam 36 is required, the configuration of the side frame member may differ as exemplified by the side frame member 50A seen in FIG. 6. Frame member 50A includes a recess 79 at the panel edge in the rear face of the panel for mating with the illustrated side frame member 48 to form a rabbet joint. In the in-line seam 38 of FIG. 7, the edge frame members 48 and 50 define interfacing edge surfaces 80 that abut one another with shielding layers 43 captured between them. In the corner seam of FIG. 6, one surface 80 of side frame member 48 interfaces with a surface 82 defined within the recess 79.

In accordance with a further feature of the invention, each abutting surface 80 and 82 includes a groove or channel 84 extending along its length. Each channel 84 is spaced from both the front and rear corner of the corresponding edge frame member, and intersects with holes 86 provided in the edge frame members for receiving bolts 88 or 90 used to attach the panels of the enclosure 10 together. Each groove may extend the full length of the edge frame member, or if desired may terminate near the corners 52 of the panel. The width of the channels 84 is greater than the diameter of the holes 86 and the diameter of the bolts 88 and 90.

A typical in-line seam 38 between panels 14 and 16 is illustrated in FIG. 7. At a number of spaced locations along the sides of panels 14 and 16, bolts 88 and nuts 92 hold the side frame members 50 and 48 of panels 14 and 16 together. Bolts 88 are received in the aligned holes 86. As the bolts 88 and nuts 92 are tightened, the frame members 48 and 50 are drawn toward one another, and as a result of the flexing or floating movement of the frame members 48 and 50 made possible by the present invention, intimate contact is achieved between the shielding layers 43 clamped between the surfaces 80.

As illustrated in FIG. 8, intimate, low resistance, gap free contact between layers 43 is obtained even if the side frame members 48 and/or 50 are not straight. FIG. 8 in comparison with FIG. 7 demonstrates that the frame members 48 and 50 can float or flex as necessary to comply with an irregular panel side edge. The slack regions 78 in the layer 23 permit this compliance to take place with out ripping or tearing of the layer 43.

A typical corner seam 36 at the juncture of panels 12 and 14 is shown in FIG. 6. Bolts 90 and recessed Tnuts 94 hold the side frame members 48 and 50A together. Bolts 90 are received in aligned holes 86. As the bolts 90 are tightened, the frame members are drawn toward one another, and as a result of the flexing or floating movement of the frame member 48 made possible by the present invention, intimate contact is achieved between the shielding layers 43 clamped between the surfaces 80 and 82. Compliance to irregular panel edge shapes is achieved in a manner similar to the in-line seam described above.

The grooves 84 in the surfaces 80 and 82 define the regions of contact between layers 43 of adjacent panels and assure that the contact force between the edge frame members is concentrated along the outer portions of the surfaces 80 and 82 near the front and rear faces of the panels. This prevents gaps in the contact that might otherwise result from a warped edge frame member. In addition, since a pair of parallel contact areas are formed to either side of the grooves 84, a redundant or duplicate contact system is provided. Moreover, the grooves serve as a recess in each location where a bolt 88 or 90 extends through layers 43, and burrs or the like in the layers 43 cannot result in gaps in the seams 36 or 48. Another advantage flowing from the grooves 84 is the assurance that a line of contact between layers 43 is present between the bolts 88 or 90 and the exterior of the enclosure 10 to provide improved shielding at high frequencies. The grooves 84 reduce the area of contact between the interfacing conductive layers 43 at the surfaces 80 and 82 and the mating contact pressure is increased for a given joint compression force applied by the bolts 88 or 90.

At least some of these advantages may be obtained by using only a single groove 84 in one but not both of a pair of abutting edge frame members. In addition, the use of one or two grooves such as the grooves 84 provides similar advantages in shielded panels of many different types, and may be used in panel configurations other than those illustrated in the drawings.

Each of the seams between panels of the enclosure 10, including seams between wall panels, ceiling panels and floor panels, as well as wall-ceiling and wall-floor junctions, may be either an in-line seam like seam 38 or a corner seam like seam 36. When the panel system of the present invention is employed, each seam is characterized by freedom from gaps in contact of layers 43 of adjacent panels, and this is accomplished without the need for expensive materials and/or careful selection or shaping of the components. All of the seams exhibit high conductivity and an absence of radiation leakage paths.

This invention has been described by reference to details of the preferred embodiment of the invention illustrated in the drawings. These details are not intended to limit the scope of the invention as defined in the following claims.

I claim:

1. A panel for an EMI shielded enclosure comprising:

a panel frame including edge frame elements located at the periphery of the panel and an internal frame element extending between a pair of said edge frame elements;

a substantially rigid shield support member overlying said panel frame at one face of the panel;

a flexible layer of metal shield material overlying said shield support member and extending around at least said pair of said edge frame elements;

said flexible layer being attached to said shield support member and said shield support member being attached to said internal frame element; and a floating attachment structure joining said internal frame element to said edge frame elements for permitting said edge frame elements to assume an edge configuration independent of said shield support member and said internal frame element.

2. A panel for an EMI shielded enclosure as claimed in claim 1, wherein the periphery of said shield support member is inset from said periphery of the panel.

3. A panel for an EMI shielded enclosure as claimed in claim 2, said flexible layer including slack in the region between said periphery of said shield support member and said periphery of the panel.

4. A panel for an EMI shielded enclosure as claimed in claim 1 wherein said flexible layer is adhesively bonded to said shield support member.

5. A panel for an EMI shielded enclosure as claimed in claim 1 wherein said flexible layer is fastened to said pair of edge frame elements.

6. A panel for an EMI shielded enclosure as claimed in claim 1, said edge frame elements including a pair of end elements and a pair of side elements attached at corners of the panel, and said internal frame element extends between said side elements generally parallel to said end elements.

7. A panel for an EMI shielded enclosure as claimed in claim 6 wherein said shield support member is attached to said edge frame elements only adjacent said corners.

8. A panel for an EMI shielded enclosure as claimed in claim 6 comprising a plurality of said internal frame elements.

9. A panel for an EMI shielded enclosure as claimed in claim 1 wherein said shield support member is a panel substrate generally coextensive in area with the face of the panel.

10. A panel seam construction for an EMI shielded enclosure comprising:

a first panel having a face and an edge including an edge frame member;

a second panel having a face and an edge including an edge frame member;

a pair of layers of conductive shielding material, one covering the face and extending across the edge frame member of each of said first and second panels;

said edge frame members each having an outer corner adjacent the panel face, an inner corner spaced from the panel face and a generally planar abutment surface extending between said corners;

at least one of said edge frame members having an elongated groove extending along at least part of the length of said one edge frame member in said abutment surface to define a recess in said abutment surface between said corners; and a fastener extending through said edge frame members of said first and second panels for drawing said edge frame members together in abutting, parallel, side-by-side relationship with said layers clamped between said abutment surfaces, said fastener extending along a line intersecting said recess.

11. A panel seam construction as claimed in claim 10 wherein both of said edge frame members include one said elongated groove.

12. A panel seam construction as claimed in claim 10 comprising a plurality of said fasteners arrayed along the length of said groove.

13. A panel seam construction as claimed in claim 10, said groove having a width greater than the diameter of said fastener.

14. A panel seam construction as claimed in claim 10 further comprising means mounting at least one of said edge frame members for flexible movement relative to the face of the corresponding panel.

15. A panel seam construction as claimed in claim 14, each said panel including a shield support member disposed at the face of the panel and adhesive bonding said layers to said shield support members.

16. A panel seam construction as claimed in claim 15 further comprising an adhesive free region along the edge of said shield support member adjacent said edge support member.

17. A panel for an EMI shielded enclosure comprising:

a frame including opposed pairs of flexible elongated edge frame members bounding the periphery of the panel and having ends joined together at corners of the panel;

a substrate at one face of the panel generally coextensive with the face of the panel;

means attaching said substrate to said edge frame members adjacent said corners;

the portions of at least one opposed pair of said edge frame members spaced from said corners being mounted for flexible, floating movement relative to said substrate in a direction parallel to said panel face; and a layer of flexible conductive shield material overlying said substrate and extending around said edge frame members.

18. A panel for an EMI shielded enclosure as claimed in claim 17, said layer being attached to said edge frame members and to said substrate.

19. A panel for an EMI shielded enclosure as claimed in claim 18 further comprising an adhesive bonding said layer to said substrate, and an adhesive free region between said layer and said substrate adjacent said opposed pair of edge frame members.

20. A panel for an EMI shielded enclosure as claimed in claim 19, wherein the peripheral edges of said substrate are spaced inwardly from the periphery of the panel.

21. A panel for an EMI shielded enclosure as claimed in claim 20 further comprising slack portions of said layer disposed between the periphery of said substrate and said opposed pair of edge frame members.

22. A panel for an EMI shielded enclosure as claimed in claim 17, said opposed pair of edge frame members including outwardly directed contact surfaces generally perpendicular to the face of the panel, said layer extending across said contact surfaces, and elongated grooves in said contact surfaces extending along at least part of the length of said opposed pair of edge frame members.

23. A panel for an EMI shielded enclosure as claimed in claim 17 further comprising an internal frame element extending between said opposed pair of edge frame members, and a floating attachment structure joining said internal frame member to said opposed pair of edge frame members.

* * * * *